United States Patent [19]

Ruwe et al.

[11] 4,399,488
[45] Aug. 16, 1983

[54] RIGHT CIRCULAR SUBSTRATE PACKAGING

[75] Inventors: Victor W. Ruwe; James A. Kerr, both of Huntsville, Ala.; Rene F. Sandeau, Jr., Maitland, Fla.

[73] Assignee: The United States of America as represented by the Secretary of the Army, Washington, D.C.

[21] Appl. No.: 289,606

[22] Filed: Aug. 3, 1981

[51] Int. Cl.³ .............................................. H05K 1/14
[52] U.S. Cl. ................................... 361/412; 361/413; 361/398; 339/17 M
[58] Field of Search ............ 339/17 R, 17 F, 17 LM, 339/17 M; 361/380, 395, 396, 412, 413, 419, 420, 398

[56] References Cited

U.S. PATENT DOCUMENTS

| 3,596,140 | 7/1971 | Walsh | 339/17 M |
| 3,755,891 | 9/1973 | Muckelroy et al. | 361/412 |
| 3,763,455 | 10/1973 | Confer et al. | 339/35 |
| 3,951,493 | 4/1976 | Kozel et al. | 339/17 M |
| 4,173,035 | 10/1979 | Hoyt | 339/17 LM |

Primary Examiner—G. P. Tolin
Attorney, Agent, or Firm—Robert P. Gibson; Anthony T. Lane; James T. Deaton

[57] ABSTRACT

Packaging of microelectronics utilizing a series of various size cylinders which are assembled and sealed from the environment, providing electrical connections out opposite ends of the cylinders and providing for a center opening in the inner cylinder to allow other structure such as a warhead to be mounted therein are aspects of this invention.

5 Claims, 5 Drawing Figures

RIGHT CIRCULAR SUBSTRATE PACKAGING

DEDICATORY CLAUSE

The invention described herein may be manufactured, used, and licensed by or for the Government for governmental purposes without the payment to us of any royalties thereon.

BACKGROUND OF THE INVENTION

In the past, microelectronics have basically been packaged on flat surfaces and therefore into shapes that do not take full advantage of the circular shape of a missile. Therefore, it can be seen that the higher packaging density of approximately 30%, due to a circular shape with ease of interconnection and sealing in structural assembly to other missile components, is needed.

In view of the need, it is an object of this invention to provide a circular shaped packaging device for containing microelectronics therein and providing a central opening for mounting of other structure such as a warhead therein.

Another object of this invention is to provide a circular packaging arrangement for microelectronics in which the assembly includes a plurality of concentric cylinders that are easily sealed at the opposite ends thereof and with electrical connection means at each end.

Still another object of this invention is to provide a circular packaging assembly for microelectronics which can be assembled parallel to the missile line of flight and have an opening for storage in the center of the packaging assembly.

Still another object of this invention is to provide a circular packaging arrangement which can be produced at relatively low cost.

Other objects and advantages of this invention will be obvious to those skilled in this art.

SUMMARY OF THE INVENTION

In accordance with this invention, a circular packaging device is provided which includes a multiplicity of concentric cylinders that are configured and assembled with electronic components on the outside and/or inside surfaces of the cylinders with the cylinders being spaced with insulation spacers between the cylinders and with end caps for opposite ends of the cylinders with lead connections mounted in the end caps for connecting to individual circuits mounted on the cylinders and for providing for interconnections through the assembly.

DESCRIPTION OF THE PREFERRED EMBODIMENT

Figure 1:
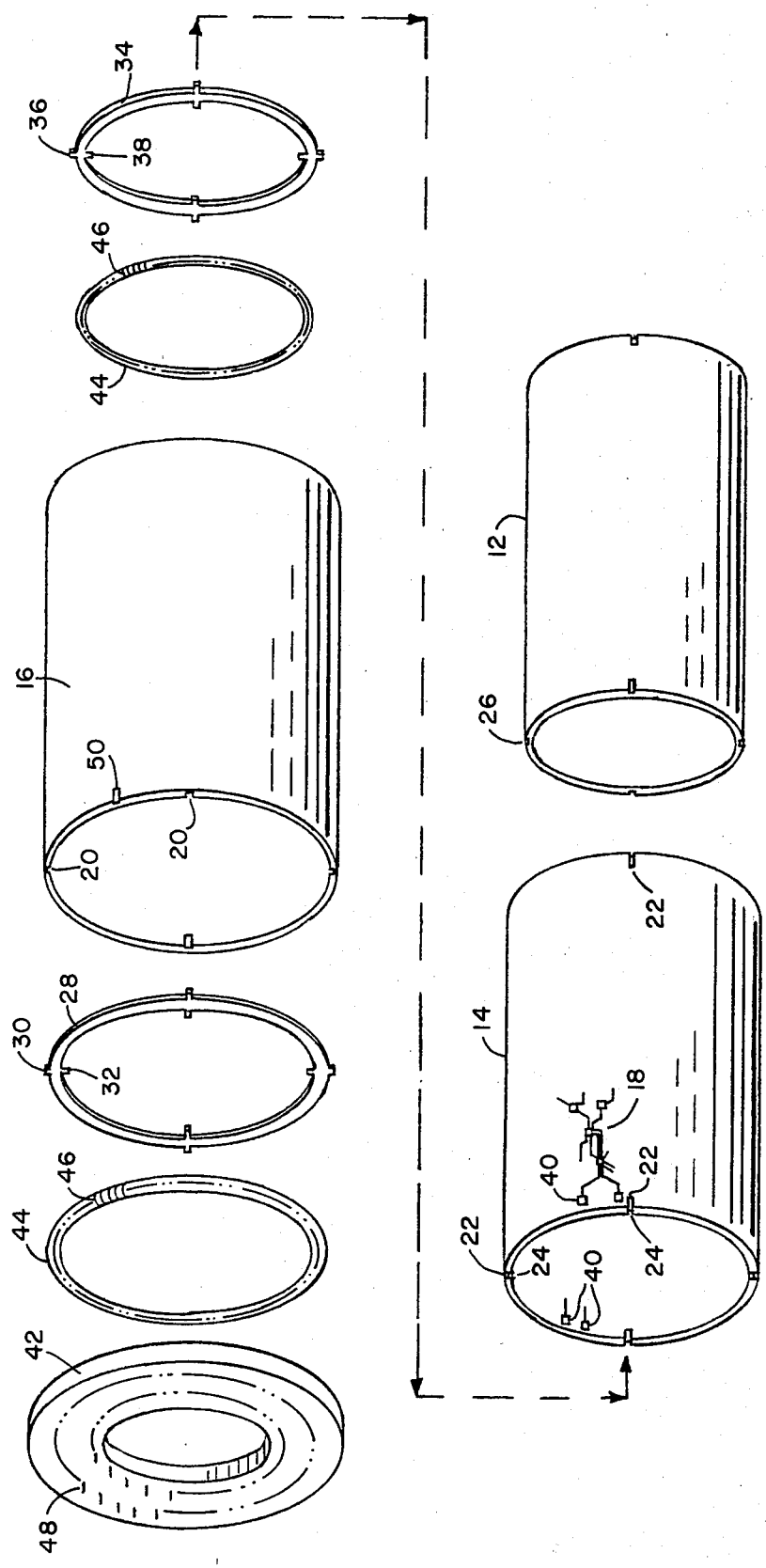
FIG. 1 is an exploded view of the packaging apparatus in accordance with this invention.
Figure 2:
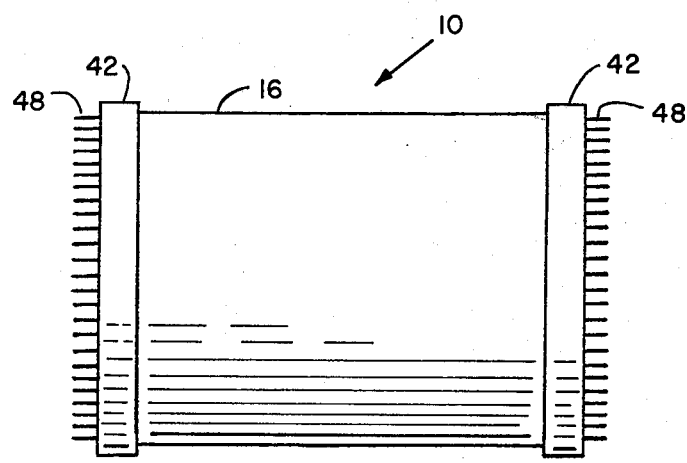
FIG. 2 is a side view of the packaging device in accordance with this invention.
Figure 3:
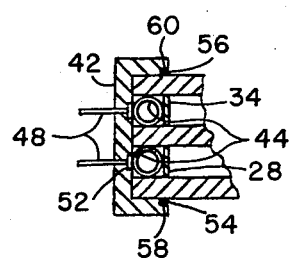
FIG. 3 is a sectional view and partially cutaway illustrating the end cap and connector structure.

Referringg now to the drawing, in FIGS. 1 and 2 the packaging assembly 10 is illustrated as including an inner cylinder 12 and intermediate cylinder 14 and an outer most cylinder 16. Each of cylinders 12, 14 and 16 are made of appropriate substrate material for mounting electrical circuitry thereon such as by being mounted thereon using etching of conventional PC process, circuits that are bonded to the surface in the form of applique or other conventional methods of placing appropriate circuitry thereon. When 3 cylinders are utilized as illustrated, the outer surface only of cylinder 12 is utilized for mounting circuits thereon and the inner surface only of cylinder 16 is utilized for mounting circuits thereon. Intermediate cylinder 14 can have circuits on both the inner and outer surfaces thereof. Even though only 3 cylinders are illustrated, any number of cylinders desired can be utilized and each of the inner cylinders can have circuits on the inner and outer surfaces thereof. Therefore, it can be seen that the number of cylinders used in the packaging operation will depend upon the amount of electronics needed for the missile. Also for illustration purposes intermediate cylinder 14 has schematically illustrated thereon circuit components 18. It is pointed out that when the circuits are placed on the cylinders, leads 40 innerconnecting the circuits to other structure will be at the ends of each of the cylinders for connection out from the cylinders or for interconnection with different cylinder components. Cylinder 16 has four grooves 20 in the inner surface thereof at each end of cylinder 16 and cylinder 14 has grooves 22 at each end thereof in the outer surface of cylinder 14 and grooves 24 at each end in the inner surface of cylinder 14. Cylinder 12 has four outer grooves 26 at each end for mounting and indexing purposes. An insulator spacer ring 28 has radial outward projections 30 and radial inward projections 32 and insulator ring 34 has radial outward projections 36 and radial inward projections 38. Inward projections 38 fit into grooves 26 of inner cylinder 12 and radial projections 36 fit into grooves 24 of intermediate cylinder 14 for mounting cylinder 12 relative to cylinder 14. Inward projections 32 of ring 28 fit into grooves 22 of cylinder 14 and outward projections 30 of ring 28 fit into grooves 20 of cylinder 16 to mount cylinders 14 and 16 relative to each other. If more than three cylinders are used, obviously more rings of different diameters will be used to mount the cylinders relative to each other. Also, insulator rings 28 and 34 are utilized at each end of cylinders 12, 14, and 16 to mount the cylinders relative to each other. Circuits 18 have a multiplicity of leads 40 that are schematically illustrated and appropriately placed around the cylinders that are adapted to be connected out through end caps 42 at each end of the assembly. This is accomplished by resilient rings 44 that have a multiplicity of line circuits 46 therearound which connect between leads 40 and bases 52 of pin connectors 48 (See FIG. 3) that are mounted on cap 42. Ring 44 is a ring of resilient insulating material that insulates between line circuits 46. Cap rings 44 are positioned between each of the cylinders and at opposite ends of the cylinders and caps 42 are placed at each end of the cylinders. Cap 42 is keyed in a conventional manner such as by a projection on the cap (not illustrated) and a groove 50 (See FIG. 1) on the cylinders. In this way, pins 48 can be marked to denote exactly which internal circuits are connected to which pins. Pins 48 of FIG. 3 have flat bases 52 for electrically connecting between pin 48 and the circuit 46 of ring 44. End cap 42 has outer and inner grooves 54 and 56 that have preformed solder 58 and 60 therein that is sealed to the outer and inner periphery of the cylinder package. If desired, the spaces between the cylinders can be evacuated and filled with inert gas as desired.

Figure 4:
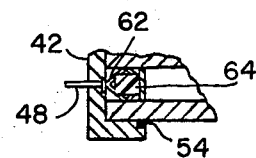
FIG. 4 is an alternate structure for the end cap and connector structure.

FIG. 4 illustrates another form of cap connector in which pin 48 is made integral with flexible leads 62 which make contact with appropriate leads 40. Each of flexible leads 62 are mounted onto a ring 64 of an insulating material such as bakelite. Pins 48 are mounted and sealed in cap 42 in a conventional manner.

Figure 5:
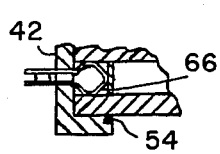
FIG. 5 is still another alternate end cap and pin connector structure in accordance with this invention.

FIG. 5 illustrates another embodiment of end cap 42 with spring contacts 66 in which the spring contacts are individually mounted in end cap 42 and sealed relative thereto in a conventional manner.

In operation, with the required electronics for the particular missile being determined and the number of cylinders needed being determined, appropriate electronics are mounted on the surfaces of the cylinders. The cylinders are then telescoped together with insulator spacer rings 28 and 34 being utilized to space the cylinders relative to each other. Then, the appropriate end cap 42 is inserted over each end of the cylinders and sealed relative to the cylinders by an arrangement such as preformed solder between cap 42 and the surfaces of the cylinders. The cap has the various pins thereof innerconnected to the circuit leads in accordance with the particular connector between the pin and the leads that are to be used with a particular arrangement. As previously pointed out, if desired the spaces between the cylinders are evacuated in a conventional manner and filled with an inert gas. The package can then be mounted on a missile as a circular section of the missile and the electronics can be balanced and have a common axis with the axis of the missile. Further, by providing this particular packaging arrangement high density packaging is achieved along with ease of innerconnection, lower cost, sealing against moisture, and allowing positioning of the cylindrical structure parallel to the missile line of flight. It is also pointed out that the cylindrical packaging arrangement disclosed by applicants provides maximum volumetric utilization of the space available and an assembly which can withstand the specified environments. By using cylinders, an opening is provided in the inner most cylinder in which other structure such as a warhead can be mounted for the missile.

We claim:

1. A cylindrical electronic packaging arrangement comprising a plurality of elongated cylinders of different diameters and having electronic components mounted on surfaces thereof with output leads from the surfaces located at the ends of the cylinders, insulating spacer means between the cylinders and being keyed to the cylinders to space the cylinders relative to each other, an end cap over the end of the cylinders at each end and having connector pins connected through connector means to innerconnect the output leads with the connector pins in the end cap to connect the electronic components out through said end cap, and said end cap being sealed relative to said cylinders.

2. A cylindrical packaging arrangement as set forth in claim 1, wherein said insulating spacer means includes a ring between each cylinder at each end of the cylinders and having projections thereon for mating with grooves in the cylinders for spacing and mounting the cylinders relative to each other.

3. A cylindrical packaging arrangement as set forth in claim 2, wherein said end cap has solder mounted therein that solders the end cap relative to said cylinders to seal said end cap relative to said cylinders.

4. A cylindrical packaging assembly as set forth in claim 1, wherein said connector means for connecting between said pins and said output leads includes a connector ring that is made of insulating resilient material with circuits mounted on the surface of said ring for innerconnecting the output leads to said pins.

5. A cylindrical packaging assembly as set forth in claim 1, wherein said connector means includes spring contacts which are integral with said pins and said spring contacts making contact with said output leads.

* * * * *